(12) United States Patent
Buchhold et al.

(10) Patent No.: US 11,025,055 B2
(45) Date of Patent: Jun. 1, 2021

(54) INVERTER WITH AT LEAST TWO DIRECT CONVERTERS

(71) Applicant: SMA Solar Technology AG, Niestetal (DE)

(72) Inventors: Stefan Buchhold, Lohfelden (DE); Jens Friebe, Vellmar (DE); Michael Kotthaus, Niestetal (DE); Torsten Soederberg, Soehrewald (DE); Thomas Wappler, Guxhagen (DE); Ephraim Moeser, Fuldatal (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 16/661,318

(22) Filed: Oct. 23, 2019

(65) Prior Publication Data

US 2020/0136383 A1    Apr. 30, 2020

(30) Foreign Application Priority Data

Oct. 30, 2018   (DE) .................... 10 2018 127 130.1

(51) Int. Cl.
| | | |
|---|---|---|
| *H02J 1/10* | (2006.01) | |
| *H02J 3/38* | (2006.01) | |
| *H01L 31/02* | (2006.01) | |
| *H02S 40/32* | (2014.01) | |
| *H01L 31/05* | (2014.01) | |
| *H02M 3/04* | (2006.01) | |

(52) U.S. Cl.
CPC .......... *H02J 1/10* (2013.01); *H01L 31/02021* (2013.01); *H01L 31/05* (2013.01); *H02J 3/383* (2013.01); *H02S 40/32* (2014.12); *H02M 3/04* (2013.01)

(58) Field of Classification Search
CPC ......................................................... H02J 1/10
USPC ............................................................ 307/45
See application file for complete search history.

(56) References Cited

U.S. PATENT DOCUMENTS

| | | | |
|---|---|---|---|
| 2007/0164612 A1* | 7/2007 | Wendt ..................... | H02J 3/385 |
| | | | 307/45 |
| 2011/0211822 A1 | 6/2011 | Choi | |
| 2013/0170088 A1 | 7/2013 | Willer | |
| 2013/0170271 A1 | 7/2013 | Stockinger | |
| 2014/0001864 A1 | 1/2014 | Nirantare et al. | |
| 2015/0162748 A1 | 6/2015 | Rder et al. | |
| 2016/0006250 A1 | 1/2016 | Ramond et al. | |
| 2016/0322828 A1* | 11/2016 | Vogel ...................... | H02J 3/383 |
| 2020/0136394 A1* | 4/2020 | Buchhold ............... | H02J 3/383 |

FOREIGN PATENT DOCUMENTS

EP           3050117 A1     8/2016

* cited by examiner

*Primary Examiner* — Joseph Chang
(74) *Attorney, Agent, or Firm* — Eschweiler & Potashnik, LLC

(57) ABSTRACT

The disclosure relates to an inverter with at least one inverter bridge and at least two DC converters, the outputs of the DC converters being connected to inputs of the inverter. The inverter includes an exchangeable adapter having input terminals for connection to power sources or loads and output terminals connected via input terminals to inputs of the DC-DC converters. Within the adapter each of the output terminals is connected to one of the input terminals and/or another of the output terminals.

10 Claims, 4 Drawing Sheets

INVERTER WITH AT LEAST TWO DIRECT CONVERTERS

CROSS REFERENCE TO RELATED APPLICATIONS

This application claims priority to German Patent Application number 2018 127 130.1, filed on Oct. 30, 2018, and is hereby incorporated by reference in its entirety.

FIELD

The disclosure relates to an inverter with at least one inverter bridge and at least two DC-DC converters, where outputs of the DC-DC converters are connected to inputs of the inverter.

BACKGROUND

Inverters are used in energy supply systems, such as photovoltaic systems, to convert direct current into alternating current. The inverters are often connected to an energy supply network and generate a single-phase or multi-phase alternating current suitable for feeding into the energy supply network in terms of frequency and voltage. An inverter of this type comprises at least one output bridge circuit also referred to as an inverter bridge.

In photovoltaic (PV) systems, it can be provided that the input of the inverter bridge is directly supplied with the voltage provided by the connected power sources, such as PV generators. To be able to set up a power generation system with an intermediate voltage circuit even if the voltage of the current source is lower than a peak voltage of the AC voltage generated, inverters can be used in which one or more DC-DC converters are connected upstream of the inverter bridge. Such a DC converter, also known as a DC (direct current)/DC converter, converts the DC voltage supplied to its input into a higher DC voltage in this application, which is then provided to the inverter bridge.

Similarly, in a power generation system with an intermediate current circuit, the voltage is suitably reduced by an upstream DC-DC converter if the voltage of the current source is greater than a peak voltage of the AC voltage generated.

The PV generator may consist of several sub-generators and each sub-generator may be assigned a separate DC-DC converter. In this way, an operating point of the connected sub-generator can be set independently of the operating point of another sub-generator via the voltage transmission ratio of the assigned DC-DC converter. This enables the sub-generators to be operated at their best possible operating point even in different insolation situations.

Consistent implementation of this basic principle leads to the so-called module inverter, which comprises a number of DC-DC converters, each of which is connected to only one PV module. Each module can thus be operated advantageously at its maximum operating point. A further advantage of module inverters is provided in hazardous situations, since lines connecting the modules and the module inverter are only subjected to the relatively low voltage of a single module.

Different to the module inverter is the string inverter, in which a number of modules are connected in series to form a so-called string. In this case, the inverter is supplied with the total voltage of the string modules. The advantage here is a significantly lower effort in terms of material, for example for connecting the individual modules to the inverter.

In addition to the two extreme cases described above in the connection of modules and inverters, further applications are conceivable in which modules are connected separately to the inverter bridge via DC converters, whereas other modules are connected in series in the form of a string to the inverter bridge via a further DC converter. Such a configuration is useful, for example, if some of the modules are exposed to the same insolation conditions (these modules can then be interconnected well as a string), whereas other modules frequently experience shading due to buildings or similar structures (these modules are then advantageously coupled separately to the alternating bridge via DC converters).

The variety of possible and reasonable configurations in the coupling of modules to an inverter bridge is complex for inverter manufacturers, since they have to provide a corresponding variety of their inverter models at least for frequently used configurations, which differ in connection options and assignments of different terminals to the DC-DC converters included.

SUMMARY

One aspect of the present disclosure is to create an inverter which, without extensive modifications, makes it possible to easily assign connected (sub-) generators to existing DC-DC converters in a variety of ways.

An inverter of the type mentioned above is characterized in that it comprises an interchangeable adapter having input terminals for connection to power sources or sinks and output terminals connected to inputs of the DC-DC converters, wherein within the adapter each of the output terminals is connected to one of the input terminals and/or is connected to another of the output terminals directly or via a component, such as a diode.

The exchangeable adapter allows an optional configuration of the connection of input terminals, which are connected, for example, to the (sub-) generators on the one hand and the inputs of the DC converters of the inverter on the other hand. For example, when the inverter is used as a module inverter, an adapter can be selected in which two input terminals that can be assigned to a PV module as a (sub-) generator are each connected to the two inputs of a DC-DC converter. Each input terminal is connected to exactly one output terminal. Here, an input terminal can also have several connection options for solar modules that are connected to each other and thus permit parallel connection of solar modules.

The DC-DC converters may be configured as galvanically isolating converters. This converter type allows the potential of the converter input terminals to be adjusted independently from the potential present at the converter output terminals. Accordingly, the potential at input terminals of two different converters connected in parallel on the output side may still be independently adjusted, so that the input terminals of the two converters can be flexibly interconnected by different adapters in different ways. The input terminals may, for example, be connected in series as well as in parallel.

When used as a string inverter, on the other hand, an adapter can be used that, in one embodiment, only provides two input terminals for a string as a PV generator. Internally in the adapter, the inputs of at least two of the DC-DC converters (or, in the case of a pure string inverter, of all DC-DC converters) are connected to each other in such a way that the DC-DC converters are connected in series on the input side. The two end points of the series connection of the DC-DC converters are then connected via the adapter to the two input terminals of the adapter.

Other configurations, such as the operation of individual modules on individual DC-DC converters and a series connection of modules on one or more of the other DC-DC converters, can also be implemented using an appropriate adapter.

Instead of a product variety of all inverters, a basic model can be provided, which can be adapted to the respective application via various adapters.

In an advantageous embodiment of the inverter, the input terminals of the adapter are formed by touch-safe connectors. When attaching the adapter to a housing of the inverter, the input terminals for the DC-DC converters are, in one embodiment, contacted by the output terminals of the adapter. Relatively inexpensive connectors between the adapter and the input terminals for the DC-DC converters can be advantageously used. Unlike the input terminals of the adapter, these terminals are subjected to less mechanical stress, for example. Another advantage may be that a housing of the adapter covers the input terminals for the DC converters in particular in a way that prevents the ingress of dirt. For example, a structure for receiving the adapter can be formed in a housing of the inverter. There may also be a detection means positioned in or on the housing of the inverter in the area of the adapter, for example. The detection means can be used to determine which adapter is inserted into the inverter. This can be done, for example, via an optical coding or a coding on the adapter that can be read out by means of key elements. In this way, for example, an inverter operating mode can be adapted to the respective adapter.

BRIEF DESCRIPTION OF THE DRAWINGS

The teaching of the disclosure will be explained in more detail below with the help of examples and figures. The figures show in a.

DETAILED DESCRIPTION

Figure 1:
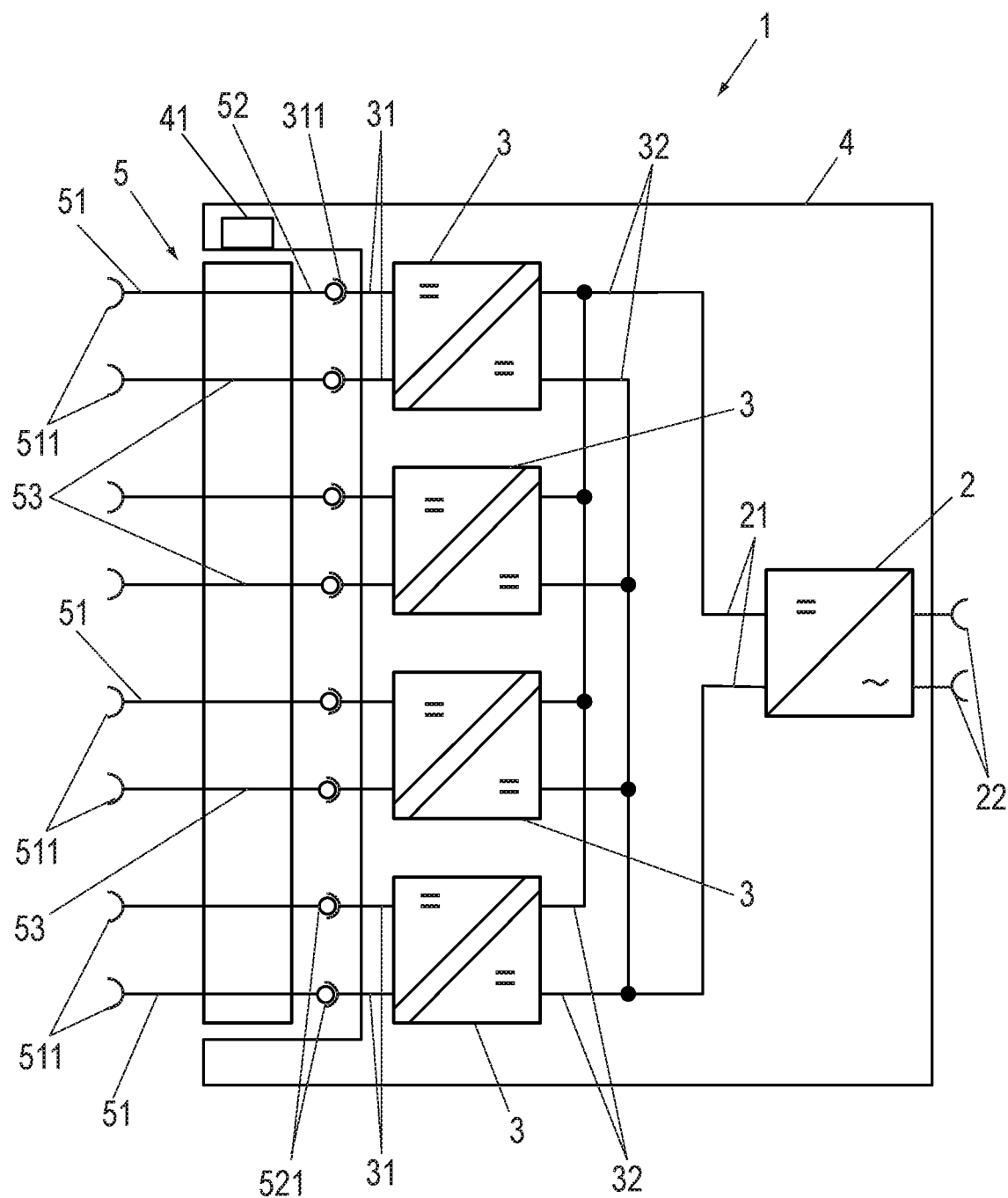
FIG. 1 is a schematic representation of a first example of an inverter with an adapter.

FIG. 1 shows in a first example an inverter 1 in a schematic block diagram. Inverter 1 includes an inverter bridge 2 that converts DC voltage supplied to inputs 21 to AC voltage provided at outputs 22. A single-phase inverter bridge 2 is shown here, whereby inverter 1 is suitable for connection to a single-phase power supply grid or to a phase of a multi-phase power supply grid. In alternative embodiments, the inverter bridge 2 may be configured as multi-phase, in particular three-phase.

Inverter 1 also comprises several DC-DC converters 3, four in this case. The DC-DC converters 3 each have a two-pole input 31 as well as a two-pole output 32. On the output side, the DC-DC converters 3 are connected in parallel and connected to the inputs 21 of the inverter bridge 2. In parallel to the inputs 21 of the inverter bridge 2, DC link capacitors can be provided, which serve to buffer the DC voltage at the inputs 21 of the inverter bridge 2. The DC-DC converters 3 are shown as galvanically isolating converters.

The inverter 1 comprises a housing 4 in which the inverter bridge 2 and the DC-DC converters 3 are arranged. As further components of inverter 1, which may also be arranged in housing 4, filters on the output side, for example a so-called sinusoidal filter, or separating or protective devices may be provided, which are not shown in the schematic drawing of FIG. 1 for reasons of clarity.

The inverter 1 also includes an adapter 5, which is connected upstream of the inputs 31 of the DC-DC converter 3. For this purpose, the inputs 31 of the DC-DC converters 3 are provided with input terminals 311, which are contacted by the adapter 5. The adapter 5 comprises outputs 52 which contact the input terminals 311 with output terminals 521. Input terminals 311 and output terminals 512 are preferably formed by interlocking connectors.

Adapter 5 in turn provides inputs 51 with input terminals 511, which represent the input terminals of inverter 1. Connections 53 between inputs 51 and outputs 52 of the adapter are provided within adapter 5. Connections 53 and the number of inputs 51 or input terminals 511 correspond to a certain configuration of an energy supply system in which the inverter 1 is used or is to be used. The connections 53 may be formed by conductive lines, lead frames or wires extending between individual input terminals 511 and output terminals 521.

As shown schematically in FIG. 1, the adapter 5 is inserted into a correspondingly provided receiving structure of the housing 4. In the implementation shown, direct contacting of the input terminals 311 of the DC-DC converter 3 with the connection cables of the power supply system is not provided. Instead, an input side contacting of the inverter 1 is made at the input terminals 511 of the adapter 5. With regard to insulation or contact protection as well as their mechanical load capacity, the input terminals 311 advantageously can be simplified compared to the input terminals 511 of the adapter 5, which are accessible from the outside and which are connected by an installer on site during installation or wiring of the power supply system. In alternative embodiments, however, it is also possible to provide for the input terminals 311 to be designed in the same way as the input terminals 511, so that the inverter 1 could also be contacted and functional without the adapter 5 and the adapter 5 represents a usage option for the inverter 1.

In the example of FIG. 1, all inputs 31 of the DC-DC converters 3 are made available independently of each other as inputs 51 of adapter 5. This corresponds to an application case for inverter 1 in which each DC-DC converter 3 is connected to a PV sub-generator independently of the other DC-DC converters 3. In such an application, inverter 1 is also referred to as a module inverter.

As an option, a detection means 41 can be present, which in the example shown is positioned in the housing of the inverter in the area of the adapter. With the detection means 41, it can be determined which adapter 5 is inserted in the inverter 1. This can be done, for example, via an optical coding or a coding that can be read out by means of key elements on the adapter 5. In this way, for example, an operating mode of inverter 1 can be adapted to the respective adapter 5.

Figure 2:
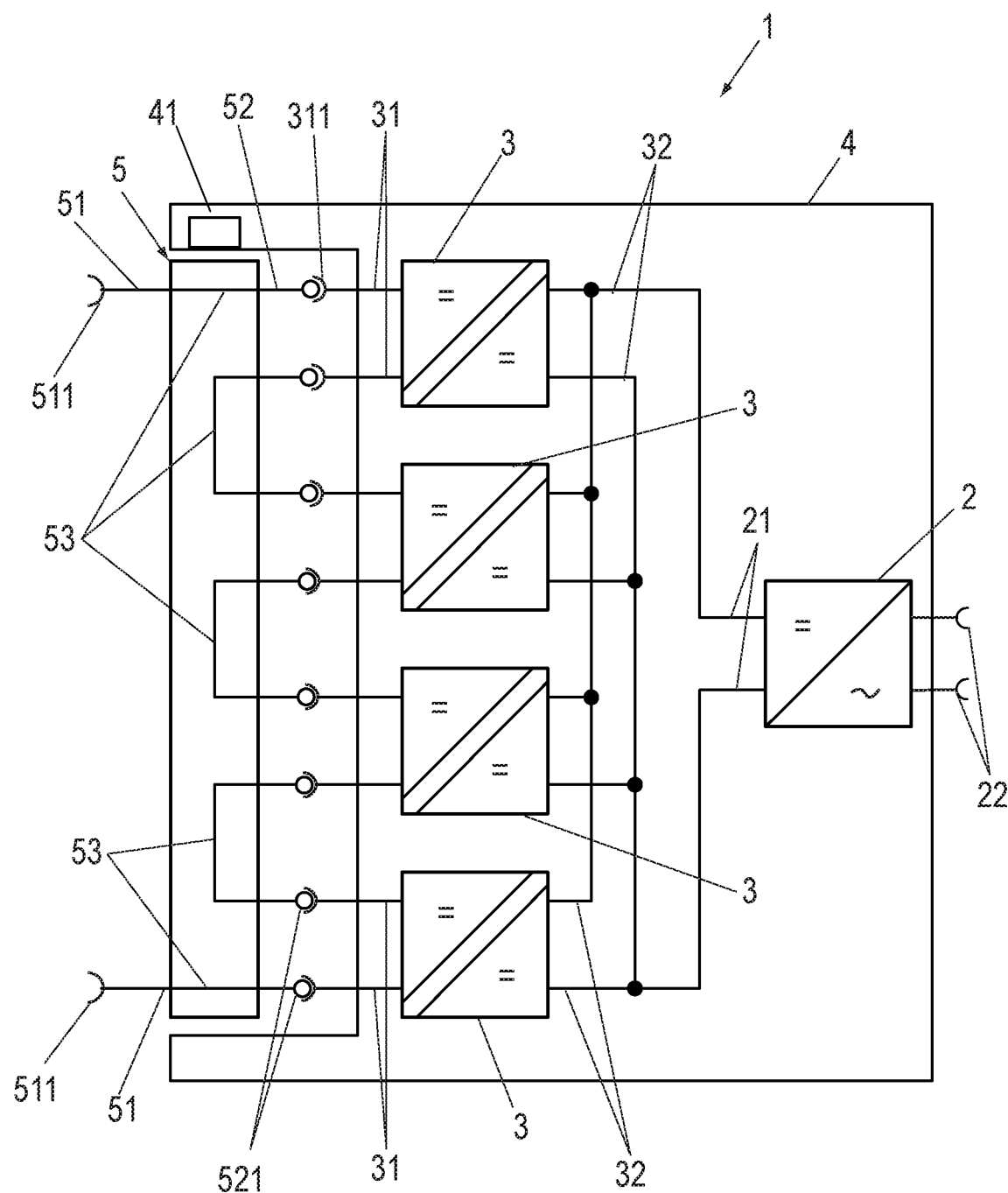
FIG. 2 is a schematic representation of a second example of an inverter with an adapter.

FIG. 2 shows an inverter 1 with adapter 5 in the same way as FIG. 1. The inverter 1 of FIG. 2 differs from the inverter of FIG. 1 by a different version of the adapter 5. With regard to the other construction of the inverter 1, reference is made to the explanations for FIG. 1.

The adapter 5 according to FIG. 2 comprises only two inputs 51 with corresponding input terminals 511. These two input terminals 511 are each connected to one output 52 or output terminal 521 of the adapter 5, which contacts one input terminal 311 and thus one input 31 of two different DC-DC converters 3. The two remaining inputs 31 of the DC-DC converters 3 mentioned above and the inputs 31 of the remaining DC-DC converters 3 are connected via adapter 5 and its corresponding outputs 52 and output terminals 521 within adapter 5 via connections 53 in such a way that the four DC-DC converters 3 are connected in series on the input side. End terminals of this series connection can be contacted from the outside via adapter 5 at the two input terminals 511.

In this configuration, which the inverter 1 experiences through the adapter 5, a single PV generator can be connected to the inverter 1, wherein the voltage of the PV generator is divided among the four existing DC-DC converters 3. The inverter 1 is therefore suitable for connecting a single PV generator which has a higher voltage than the individual PV generators of the application according to FIG. 1. Such an inverter is then also referred to as a string inverter.

By replacing adapter 5, inverter 1 is configured for the corresponding application. In the example of FIG. 2, only the input terminals 511, which are actually wired externally, need to be present on the adapter 5. The inverter 1 still has the corresponding number of input terminals 311 for each of the DC-DC converters 3. However, the input terminals 511, which are more elaborately designed, for example because of their ease of installation or protection against accidental contact, only need to be present on the adapter 5 in the smaller number actually required in the respective configuration.

Figure 3:
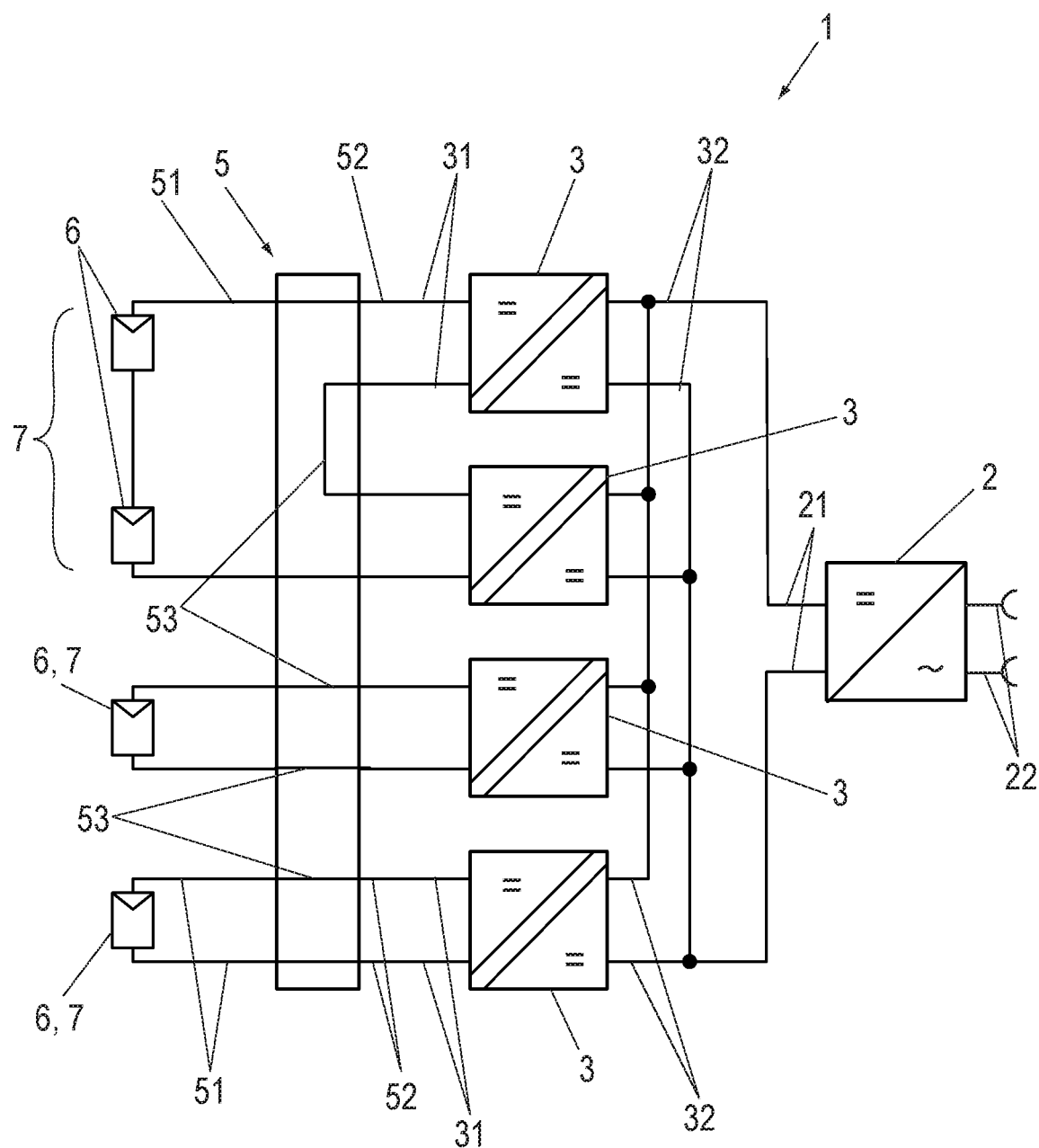
FIG. 3 is a schematic representation of a third example of an inverter with an adapter and connected PV sub-generators; and d.

FIG. 3 shows, in a simplified representation compared to FIGS. 1 and 2, a further embodiment of an inverter 1 with an adapter 5. With regard to the basic structure, reference is again made to the examples described above. For the sake of simplicity, FIG. 3 (as well as FIG. 4 described below) shows the inputs 31 of the DC-DC converters 3 and the inputs 51 and 52 of the adapter 5 without the corresponding terminals (see input terminal 311, input terminal 511 and output terminal 521 in FIGS. 1 and 2). In addition, inverter 1 is shown without housing (see housing 4 in FIGS. 1 and 2).

In the example of FIG. 3 two of the DC-DC converters 3 are connected in series by the adapter 5, wherein the series connection of the DC-DC converters 3 can be contacted via only two inputs 52 of the adapter 5. The other two of the DC-DC converters 3 can each be contacted with both inputs 31 via the adapter 5 on two corresponding inputs 52.

The example of FIG. 3 thus represents a mixture of the applications of FIGS. 1 and 2: It is possible to connect a series connection of PV sub-generators 7 with more than one PV module 6, as well as PV generators 7 with only one single PV module 6 each. In FIG. 3 and also FIG. 4, the PV modules 6 are represented by the symbol of a single PV cell as an example. It is understood that such a PV module 6 can comprise a plurality of PV cells connected in series and/or in parallel in one or more constructive units.

Figure 4:
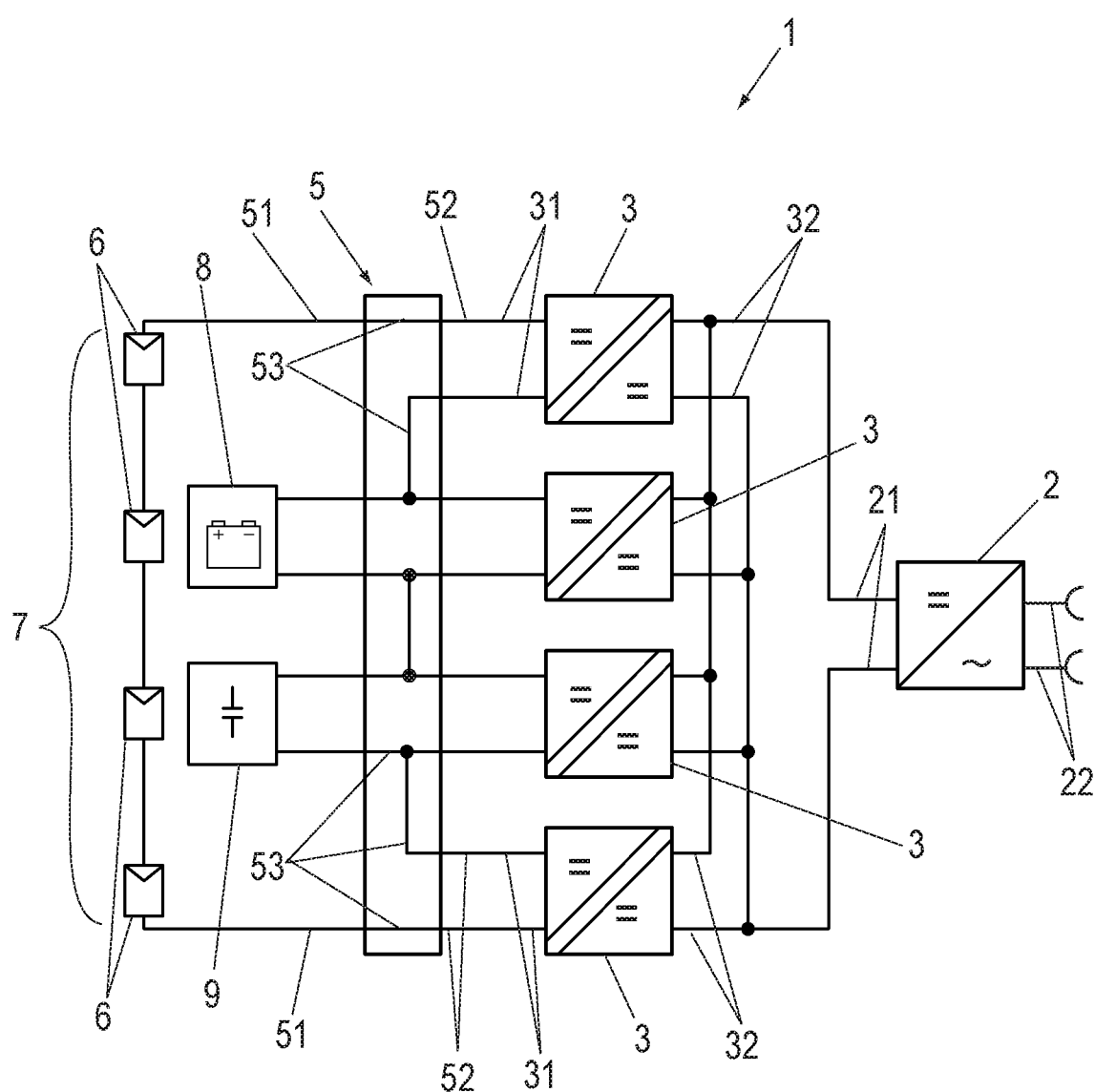
FIG. 4 is a fourth example of an inverter with an adapter and connected PV generator as well as other components.

Another example of an inverter 1 with adapter 5 is shown in the same way as in FIG. 3 in FIG. 4. In this example, the DC-DC converters 3 are connected in series via adapter 5, wherein this series connection can be connected to the PV generator 7 shown via two inputs 51 of adapter 5.

This PV generator 7 is a so-called PV string in which a number of PV modules 6, four PV modules 6, in this case are connected in series. In this example, inputs 31 of two of the DC-DC converters 3 are also connected to separate inputs 51 of the adapter 5 via corresponding connections 53. A storage module 8 or a buffer module 9 are connected to these inputs 51. By appropriate operating mode of the DC-DC converter 3, by means of which a voltage between the inputs 31 can be set, it is possible to charge the storage or buffer modules 8, 9 during operation of the PV generator 7. If the PV generator 7 delivers no or insufficient power, energy can be taken from storage module 8 or buffer module 9 and converted into alternating current by the corresponding DC-DC converter 3 and the downstream inverter bridge 2. This exemplary configuration is also made possible by the corresponding wiring in adapter 5 using the inputs 51, outputs 52 and connections 53 provided.

The invention claimed is:

1. An inverter, comprising:
    at least one inverter bridge; and
    at least two DC-DC converters, wherein outputs of the DC-DC converters are connected to inputs of the inverter bridge,
    wherein an exchangeable adapter, with input terminals for connection to power sources or loads and output terminals connected via input terminals to inputs of the DC-DC converters, and
    wherein within the exchangeable adapter each of the output terminals is fixedly, statically connected to one of the input terminals and/or another of the output terminals.

2. The inverter according to claim 1, wherein in the exchangeable adapter, each input terminal is in each case connected to exactly one output terminal in order to operate the inverter as a module inverter.

3. The inverter according to claim 1, wherein at least two output terminals of the exchangeable adapter are connected to one another in order to connect at least two of the DC-DC converters in series on an input side of the DC-DC converters.

4. The inverter according to claim 3, wherein in the exchangeable adapter all the output terminals, with an exception of the two output terminals connected to input terminals, are connected to one another in pairs in order to connect all the DC-DC converters present on the input side thereof in series and to operate the inverter as a string inverter.

5. The inverter according to claim 1, wherein the input terminals of the adapter are formed by touch-safe connectors.

6. The inverter according to claim 1, wherein the output terminals of the adapter contact the input terminals of the inputs of the DC-DC converters when attaching the adapter to a housing of the inverter.

7. The inverter according to claim 6, wherein a receiving structure for the adapter is formed in a housing of the inverter.

8. The inverter according to claim 6, wherein a housing of the adapter covers the input terminals of the inputs of the DC-DC converters.

9. The inverter according to claim 1, further comprising a detection means for determining a type of configuration of the adapter that is inserted into the inverter.

10. The inverter according to claim 1, wherein the DC-DC converters are galvanically isolating converters.

* * * * *